(12) United States Patent
Yang et al.

(10) Patent No.: US 9,349,746 B1
(45) Date of Patent: May 24, 2016

(54) METHOD OF FABRICATING DEEP TRENCH SEMICONDUCTOR DEVICES, AND DEEP TRENCH SEMICONDUCTOR DEVICES

(71) Applicant: MACRONIX INTERNATIONAL CO., LTD., Hsinchu (TW)

(72) Inventors: Ta-Hone Yang, Miaoli County (TW); Nan-Tsu Lian, Hsinchu (TW); An Chyi Wei, Hsinchu (TW); Sheng-Yuan Chang, Taipei (TW); Kuang-Chao Chen, Taipei (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 0 days.

(21) Appl. No.: 14/594,768

(22) Filed: Jan. 12, 2015

(51) Int. Cl.
*H01L 29/51* (2006.01)
*H01L 27/115* (2006.01)
*H01L 21/768* (2006.01)
*H01L 21/28* (2006.01)

(52) U.S. Cl.
CPC .... *H01L 27/11582* (2013.01); *H01L 21/28282* (2013.01); *H01L 21/76877* (2013.01); *H01L 29/511* (2013.01); *H01L 29/518* (2013.01)

(58) Field of Classification Search
CPC ............ H01L 27/11582; H01L 29/518; H01L 29/511; H01L 21/28282; H01L 21/76877
See application file for complete search history.

(56) References Cited

U.S. PATENT DOCUMENTS

2014/0269078 A1\* 9/2014 Hsiao ................ H01L 21/28282
365/185.17

\* cited by examiner

*Primary Examiner* — Roy Potter
*Assistant Examiner* — Paul Patton
(74) *Attorney, Agent, or Firm* — Baker & McKenzie LLP

(57) ABSTRACT

Present example embodiments relate generally to methods for fabricating semiconductor devices comprising forming an initial stack of alternating insulative and conductive layers over a substrate, identifying a plurality of bit line locations and word line locations for the initial stack, including a first bit line location and a first word line location, and forming, from the initial stack, a vertical arrangement of bit lines in the first bit line location, the vertical arrangement of bit lines having opposing sidewalls. The method further comprises forming a word line by forming a thin conductive layer over selected sections of the opposing sidewalls, the selected sections of the opposing sidewalls being sections within the first word line location. The forming the word line further comprises depositing conductive material adjacent to each thin conductive layer, the deposited conductive material in direct contact with the thin conductive layer.

26 Claims, 16 Drawing Sheets

US 9,349,746 B1

METHOD OF FABRICATING DEEP TRENCH SEMICONDUCTOR DEVICES, AND DEEP TRENCH SEMICONDUCTOR DEVICES

BACKGROUND

The present disclosure relates generally to semiconductor devices, and more specifically, relates to semiconductor structures, including three-dimensional (3D) gate-all-around (GAA) vertical gate (VG) structures in semiconductor devices, and methods of fabricating such semiconductor structures and devices.

There is an ever growing need by semiconductor device manufacturers to further shrink the critical dimensions of semiconductor structures and devices, to achieve greater storage capacity in smaller areas, and to do so at lower costs per bit. Three-dimensional (3D) semiconductor devices using, for example, thin film transistor (TFT) techniques, charge trapping memory techniques, and cross-point array techniques, have been increasingly applied to achieve the above needs by semiconductor manufacturers. Recent developments in semiconductor technology have included the fabrication of vertical structures in the form of 3D vertical channel (VC) NAND structures or 3D vertical gate (VG) NAND structures.

BRIEF SUMMARY

Despite recent developments in the fabrication of semiconductor devices, it is recognized in the present disclosure that one or more problems may be encountered in fabricated three-dimensional (3D) semiconductor devices. For example, problems pertaining to reliability and undesirable variations in the fabrication of the various layers and structures of 3D semiconductor devices, such as vertical channel (VC) structures and vertical gate (VG) structures, that are free of deformation, defects, and/or bending, is oftentimes difficult to achieve.

Present example embodiments relate generally to semiconductor devices and methods of fabricating semiconductor devices that address one or more problems in fabricated semiconductor devices, including those described above and in the present disclosure.

In an exemplary embodiment, a method of fabricating a semiconductor device is described in the present disclosure comprising forming an initial stack of alternating insulative and conductive layers over a substrate. The method further comprises identifying a plurality of bit line locations and word line locations for the initial stack, including a first bit line location and a first word line location. The method further comprises forming, from the initial stack, a vertical arrangement of bit lines in the first bit line location, the vertical arrangement of bit lines having opposing sidewalls. The method further comprises forming a word line in the first word line location by forming a thin conductive layer over selected sections of the opposing sidewalls, the selected sections of the opposing sidewalls being those sections within the identified first word line location. The forming the word line in the first word line location further comprises depositing conductive material adjacent to each thin conductive layer, the deposited conductive material in direct contact with the thin conductive layer.

In another exemplary embodiment, a method of fabricating a semiconductor device is described in the present disclosure comprising forming an initial stack of alternating insulative and conductive layers over a substrate. The method further comprises identifying bit line and word line locations for the initial stack. The method further comprises forming, from the initial stack, a plurality of vertical arrangements of bit lines, including a first vertical arrangement of bit lines and a second vertical arrangement of bit lines. Each of the vertical arrangement of bit lines comprise opposing sidewalls. The method further comprises forming a thin conductive layer over selected sections of the opposing sidewalls of the first vertical arrangement of bit lines and second vertical arrangement of bit lines. The selected sections of the opposing sidewalls may be those sections within the identified word line locations. The method further comprises connecting, via conductive material, each thin conductive layer formed on the first vertical arrangement of bit lines with a corresponding thin conductive layer formed on the second vertical arrangement of bit lines. Each of the corresponding thin conductive layers may be formed on the second vertical arrangement of bit lines facing the thin conductive layer formed on the first vertical arrangement of bit lines.

In another exemplary embodiment, a semiconductor device is described in the present disclosure. The semiconductor device comprises a substrate, a first vertical arrangement of bit lines and a second vertical arrangement of bit lines formed over the substrate, and a plurality of word lines. Each vertical arrangement of bit lines comprises opposing sidewalls. Each vertical arrangement of bit lines further comprises alternating insulative and conductive layers. Each word line comprises a thin conductive layer formed over selected sections of the opposing sidewalls of the first vertical arrangement of bit lines and the second vertical arrangement of bit lines. Each selected section of the opposing sidewalls may be a section within the identified word lines. Each word line may further comprise a conductive structure connecting each thin conductive layer formed on the first vertical arrangement of bit lines with a corresponding thin conductive layer formed on the second vertical arrangement of bit lines. Each corresponding thin conductive layer may be formed on the second vertical arrangement of bit lines facing the thin conductive layer formed on the first vertical arrangement of bit lines.

BRIEF DESCRIPTION OF THE DRAWINGS

For a more complete understanding of the present disclosure, example embodiments, and their advantages, reference is now made to the following description taken in conjunction with the accompanying drawings, in which like reference numbers indicate like features, and.

Although similar reference numbers may be used to refer to similar elements in the figures for convenience, it can be appreciated that each of the various example embodiments may be considered to be distinct variations.

DETAILED DESCRIPTION

Example embodiments will now be described with reference to the accompanying drawings, which form a part of the present disclosure, and which illustrate example embodiments which may be practiced. As used in the present disclosure and the appended claims, the terms "example embodiment," "exemplary embodiment," and "present embodiment" do not necessarily refer to a single embodiment, although they may, and various example embodiments may be readily combined and/or interchanged without departing from the scope or spirit of example embodiments. Furthermore, the terminology as used in the present disclosure and the appended claims is for the purpose of describing example embodiments only and is not intended to be limitations. In this respect, as used in the present disclosure and the appended claims, the term "in" may include "in" and "on," and the terms "a," "an" and "the" may include singular and plural references. Furthermore, as used in the present disclosure and the appended claims, the term "by" may also mean "from," depending on the context. Furthermore, as used in the present disclosure and the appended claims, the term "if" may also mean "when" or "upon," depending on the context. Furthermore, as used in the present disclosure and the appended claims, the words "and/or" may refer to and encompass any and all possible combinations of one or more of the associated listed items.

Figure 1A:
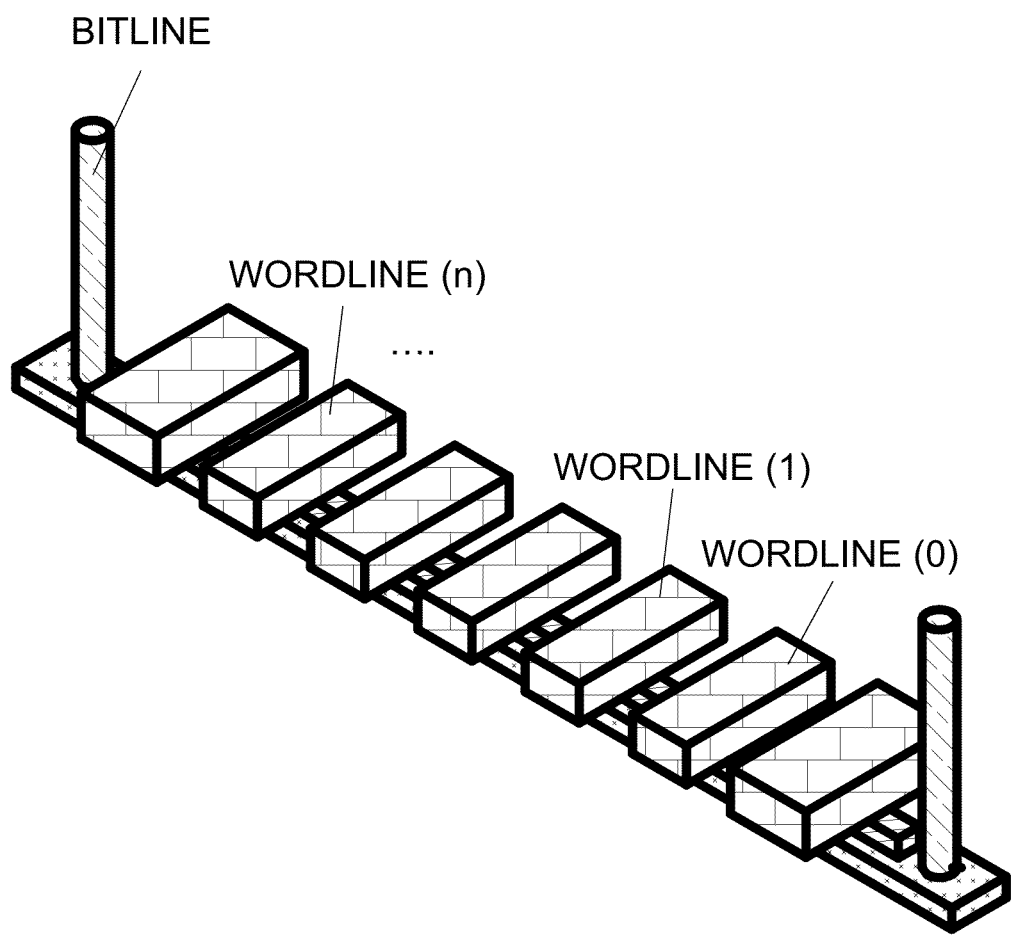
FIG. 1A is an example illustration of a two-dimensional horizontal channel device.
Figure 1B:
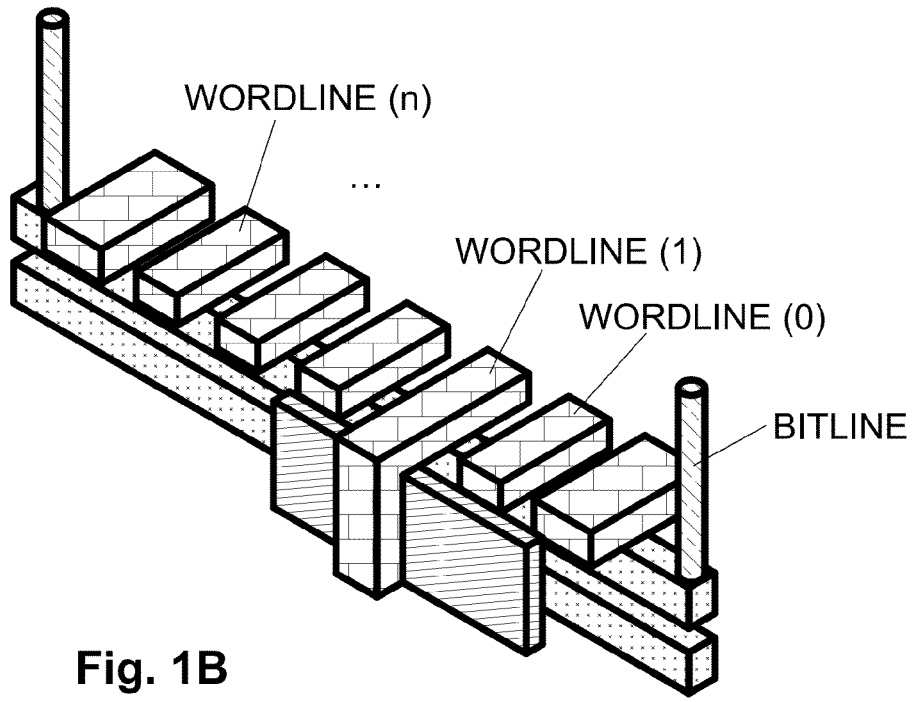
FIG. 1B is an example conceptual illustration of re-configuring a two-dimensional horizontal channel device to vertically extend the gates.
Figure 1C:
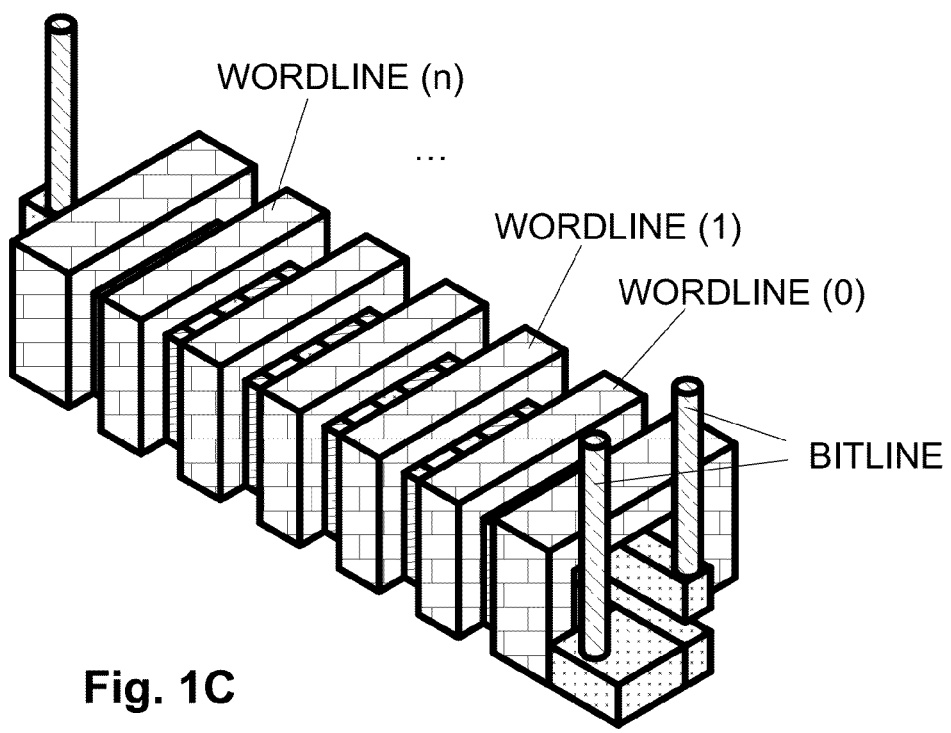
FIG. 1C is an example illustration of a three-dimensional vertical gate device.
Figure 2A:
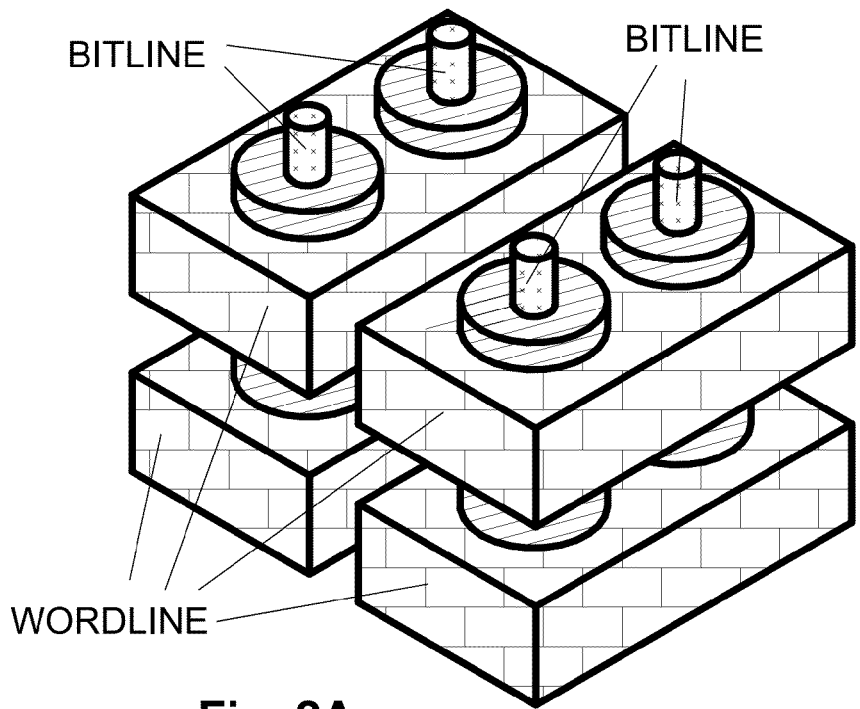
FIG. 2A is an example conceptual illustration of a footprint required for a three-dimensional vertical channel device.
Figure 2B:
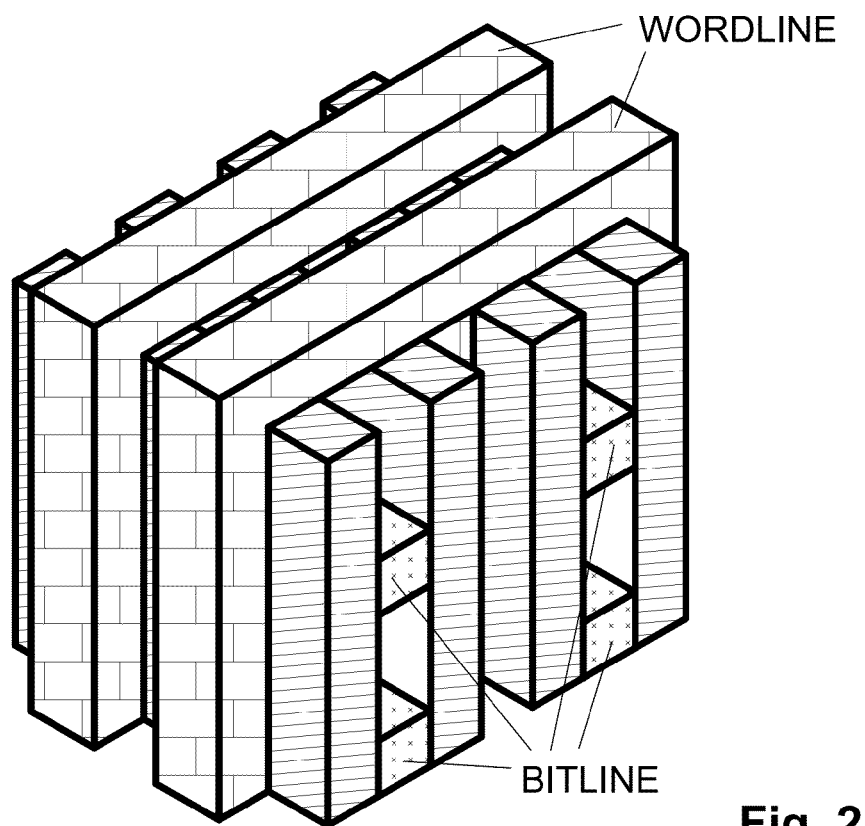
FIG. 2B is an example conceptual illustration of a footprint required for a three-dimensional vertical gate device.

Recent developments in the fabrication of semiconductor devices have led to the introduction and development of three-dimensional (3D) vertical structures, including 3D vertical gate (VG) structures, 3D vertical channel (VC) structures, and 3D gate-all-around (GAA) VG structures. In general, a 3D VG structure requires relatively smaller footprints (or areas), as compared to 3D VC structures. FIGS. 1A-C provide an example conceptual illustration of how a two-dimensional (2D) horizontal channel device relates to a 3D VG structure. As illustrated in FIGS. 1A and 1B, a 2D horizontal channel device (FIG. 1A) may be conceptually reconfigured (FIGS. 1B and 1C) so as to vertically extend the gates. As shown in the comparative examples of FIGS. 2A-B, whereas a larger capacity 3D VC device (conceptually illustrated in FIG. 2A) requires an increased footprint spanning along two axes (illustrated as X and Y axes), a larger capacity 3D VG device (conceptually illustrated in FIG. 2B) occupies an increased footprint spanning along only one axis (illustrated as X axis).

Figure 3A:
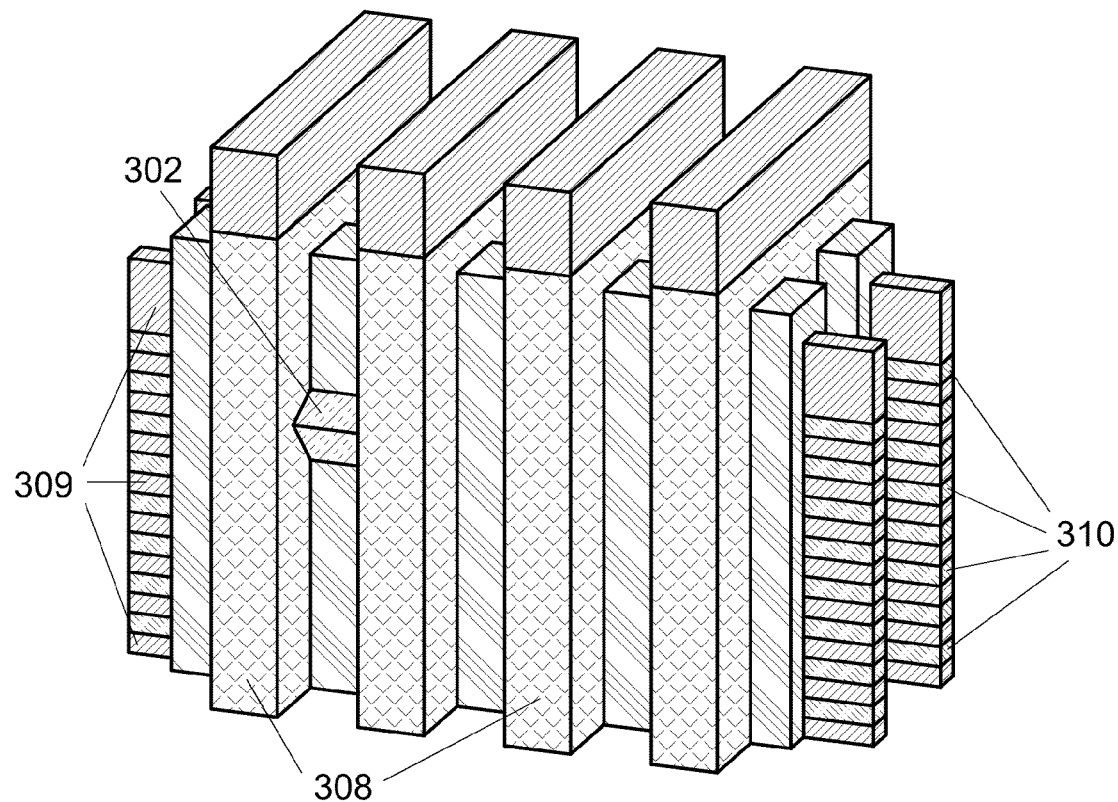
FIG. 3A is an example perspective view illustration of a stringer formed on a semiconductor device.
Figure 3B:
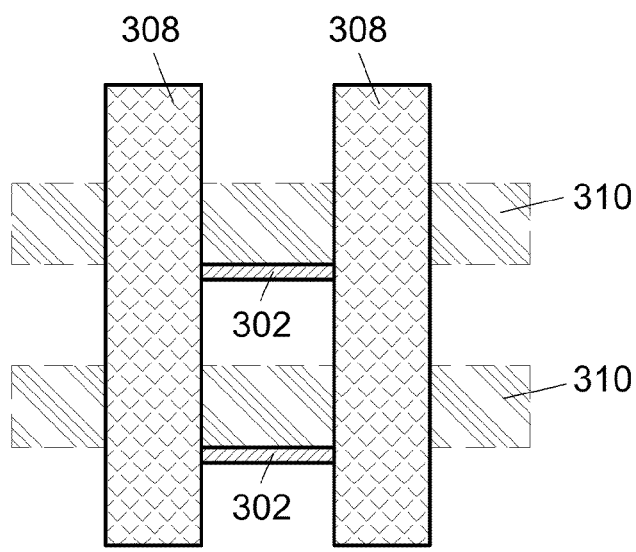
FIG. 3B is an example top view illustration of a stringer formed on a semiconductor device.

Semiconductor manufacturers oftentimes encounter difficulty in reliably fabricating 3D vertical devices and structures, including achieving reliable patterning and etching of the deep trenches formed during the fabrication of bit lines and word lines of such devices, and fabricating such devices free of deformations, defects, and/or bending of the vertical structures thereof. For example, due to the high aspect ratio requirements in such semiconductor devices, patterning or etching to form deep trenches (especially near the bottom layers or portions of the structures) is generally difficult to accurately perform and oftentimes results in undesirable portions (hereinafter called "stringers") to remain and/or form along the sidewall(s) and/or in between layers of the semiconductor devices. Such stringers, when undesirably formed, may cause, among other things, bridging effects between layers and/or structures, such as between consecutive bit lines and/or word lines, and may result in undesirable paths and/or leakage in the fabricated semiconductor device. FIGS. 3A and 3B provides an example conceptual illustration of stringers 302 undesirably formed on a semiconductor device having bit lines 310, insulating layers 309, and word lines 308.

Figure 4:
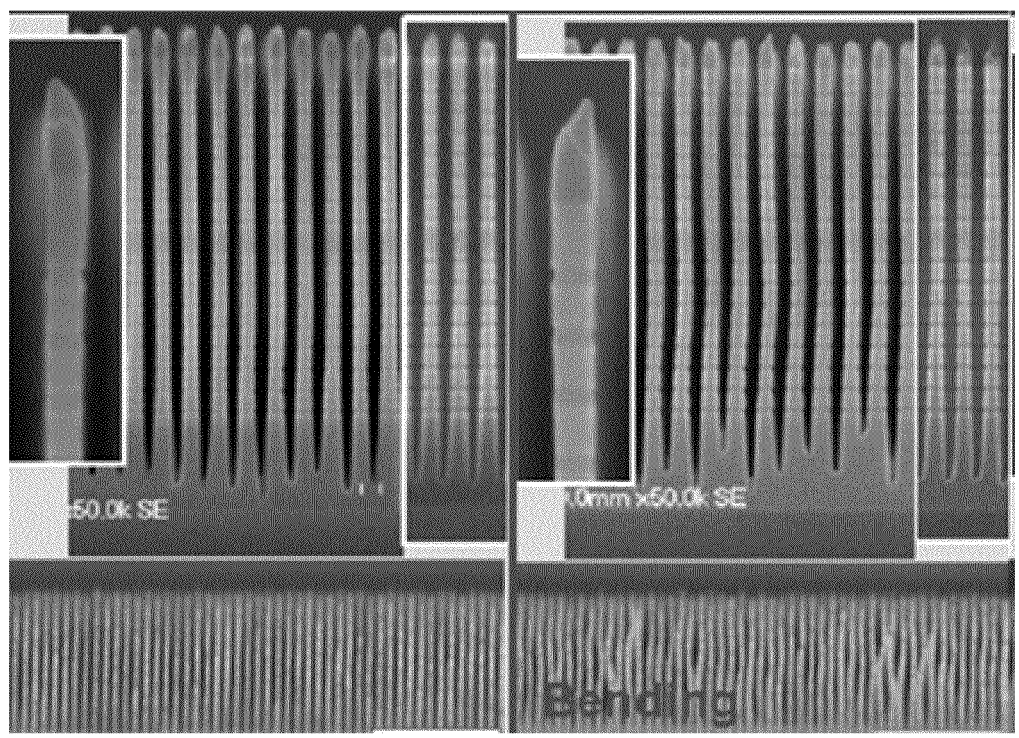
FIG. 4 is an example image illustrating a distortion, deformation, and/or bending of portions of vertical structures in three-dimensional devices.

Another problem encountered in the fabrication of 3D vertical devices and structures pertains to the oftentimes encountered deformation, distortion, and/or bending in one or more portions of one or more vertical structures of the 3D vertical structure. FIG. 4 illustrates an example of such a problem occurring in vertical structures of 3D vertical structures.

Semiconductor devices and structures, including three-dimensional (3D) vertical devices and structures, and methods of fabricating such semiconductor devices and structures, are described in the present disclosure for addressing one or more problems encountered in semiconductor devices and structures, including those described above and herein. It is to be understood in the present disclosure that the principles described herein can be applied outside the context of NAND-type and NOR-type devices, including floating gate memory devices, charge trapping memory devices, non-volatile memory devices, and/or embedded memory devices.

Figure 5:
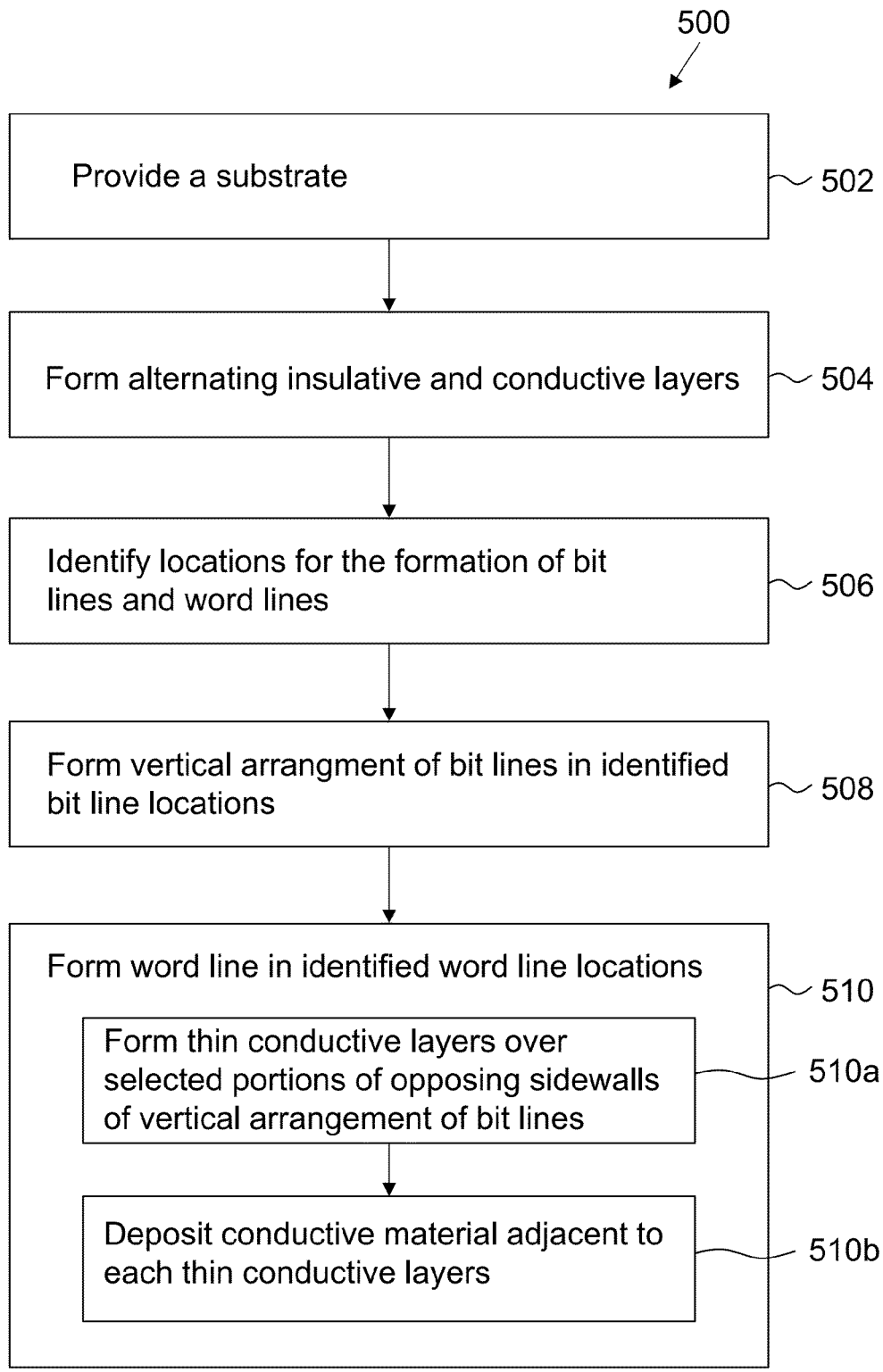
FIG. 5 is an example embodiment of a method of fabricating a three dimensional semiconductor device.

Example embodiments of methods for fabricating example embodiments of semiconductor devices and structures, such as 3D VG structures, are depicted in FIGS. 5-7. As illustrated in the sequence of actions in FIG. 5, an example embodiment of a method 500 may include providing a substrate 602 at action 502. The method 500 may further include forming an initial stack comprising a plurality of alternating insulative layers 604 and conductive layers 606 over the substrate 602 at action 504. A cross-sectional view of an example embodiment of the initial stack of alternating insulative layers 604 and conductive layers 606 formed over a substrate 602 is illustrated in FIG. 6A. The insulative materials may include oxides, and the like, and the conductive materials may include polysilicon, and the like. The method 500 may further include identifying bit line and word line locations 608 and 610 at action 506. A top view of an example embodiment of identifying bit line 608 and word line 610 locations is illustrated in FIG. 6B. The method 500 may further include forming one or more vertical arrangements of bit lines 608 at action 508. Each vertical arrangement of bit lines 608 may have opposing sidewalls 607 along the length of the vertical arrangement of bit lines 608. The vertical arrangement of bit lines 608 may be formed by removing sections of the initial stack of alternating insulative layers 604 and conductive layers 606 that are outside of the identified bit line locations 608. A perspective view of an example embodiment of vertical arrangements of bit lines 608 is illustrated in FIG. 6C. The method 500 may further include forming word lines 610 at action 510. Forming of word lines 610 may include forming one or more thin conductive layer (such as conductive layer 614, as illustrated in FIGS. 6F-J and FIGS. 7F-G) over selected sections (such as within identified word line locations 610, as illustrated in FIGS. 6F-J and FIGS. 7F-G) of the opposing sidewalls 607 at action 510a. Forming of word lines 610 may further include depositing conductive material (such as conductive material 614', as illustrated in FIGS. 6I-J and FIGS. 7F-G) adjacent to each thin conductive layer at action 510b. Each deposited conductive material may be performed so as to provide direct contact between the deposited conductive material and the thin conductive layer. In doing so, each word line 610 may be formed so as to have a portion that comprises one or more thin conductive layers and deposited conductive material in direct contact with the thin conductive layer(s) (as illustrated in the dotted box region in FIGS. 6J and 7G). Example embodiments of such a semiconductor device and/or structure 600 comprising bit lines 608 and word lines 610 are illustrated in at least FIGS. 6-7.

Example embodiments of a semiconductor device and/or structure 600 may be fabricated according to one or more of the above actions, may also include additional actions, may be performable in different sequences, and/or one or more of the actions may be combinable into a single action or divided into two or more actions. Semiconductor devices other than NAND-type and NOR-type devices are also contemplated in example embodiments without departing from the teachings of the present disclosure. These actions and semiconductor devices will now be described with references to FIGS. 5-7.

(1) Providing a Substrate (e.g., Action 502)

Substrates 602 appropriate for use in semiconductor devices and structures 600 may be obtained by any one or more manufacturing methods, such as pressing methods, float methods, down-drawn methods, redrawing methods, fusion methods, and/or the like.

(2) Forming a Plurality of Alternating Insulative Layers and Conductive Layers (e.g., Action 504)

Figure 6A:
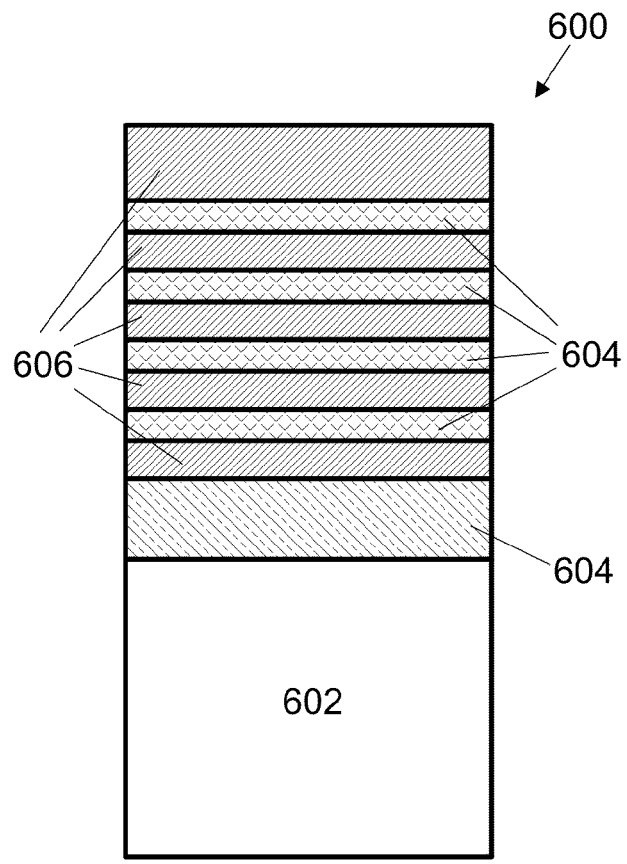
FIG. 6A is a cross-sectional view of an example embodiment of alternating insulative material layers and conductive material layers formed over a substrate.
Figure 6B:
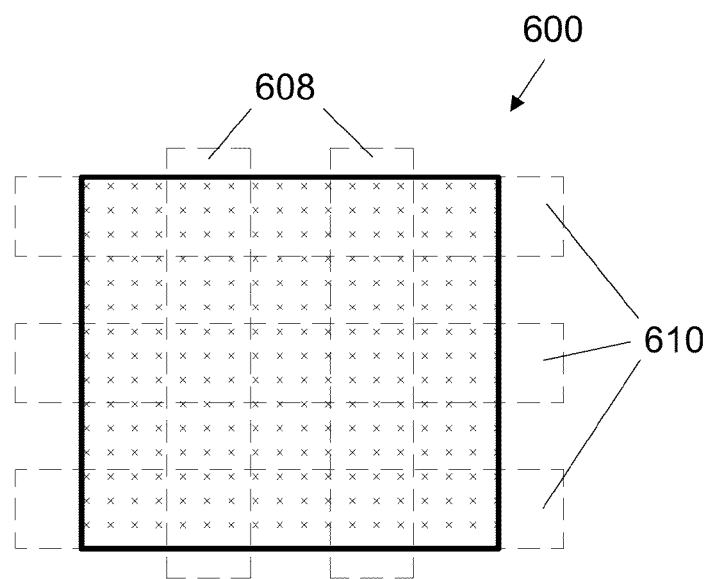
FIG. 6B is a top view of an example embodiment of identifying bit line and word line locations.

A substrate 602, such as one obtained from the above action 502, may be provided with an initial stack of alternating insulative layers 604 and conductive layers 606 formed thereon (e.g., action 504), as illustrated in the cross-sectional view of FIG. 6A. The insulative materials may include oxides, and the like, and the conductive materials may include polysilicon, and the like. The thickness of each of the conductive layers 606 may be about 200 Angstroms. It is recognized herein that the thickness of each of the conductive layers 606 may be about 100-300 Angstroms in example embodiments. The thickness of each of the insulative layers 604 may be about 800 Angstroms. It is recognized herein that the thickness of each of the insulative layers 604 may be about 100-1000 Angstroms in example embodiments.

(3) Identifying Word Line and Bit Line Locations (e.g., Action 506)

A substrate 602 having alternating insulative layers 604 and conductive layers 606 formed thereon may be subjected to an identification (or planning or designing) process whereby bit line locations 608 and word line locations 610 for the semiconductor device 600 are identified (or planned or designed) for subsequent actions (as described below and herein), including the forming of bit lines 608 and word lines 610. An example identification of bit line 608 and word line 610 locations is illustrated in the top view illustration of FIG. 6B.

(4) Forming Vertical Arrangements of Bit Lines (e.g., Action 508)

Figure 6C:
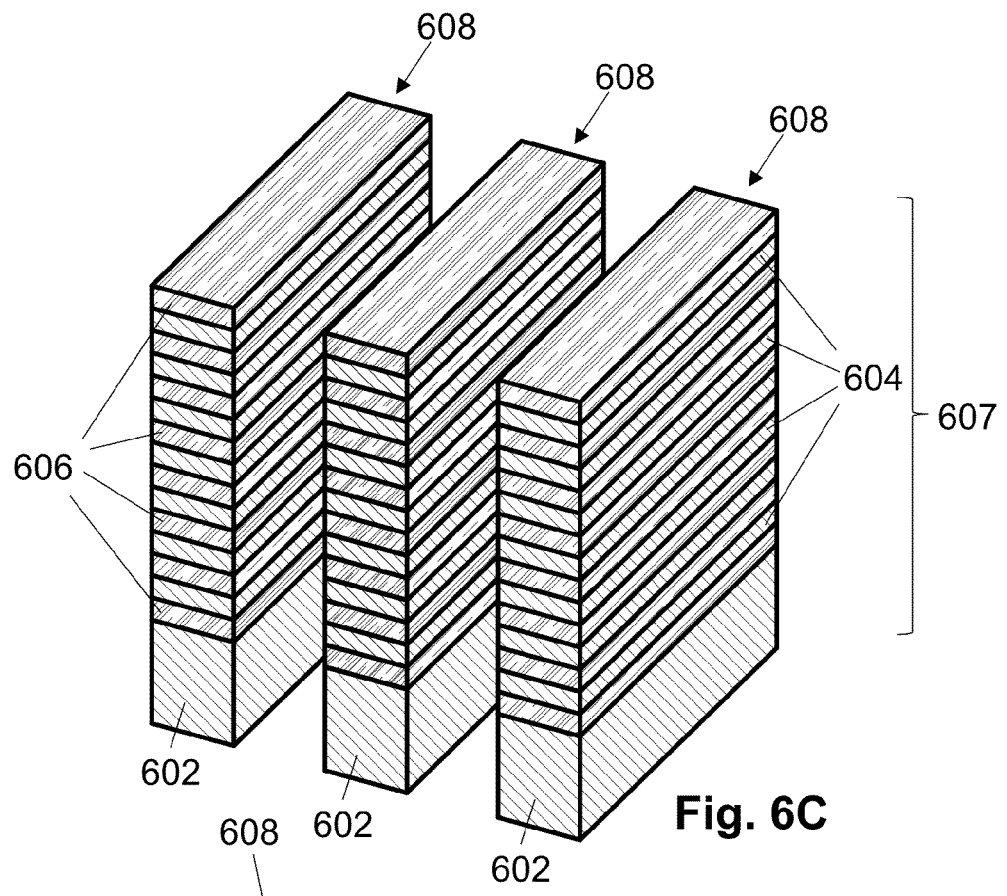
FIG. 6C is a perspective view of an example embodiment of a plurality of vertical arrangement of bit lines.

From the initial stack of alternating insulative layers 604 and conductive layers 606, one or more vertical arrangements of bit lines 608 may be formed. Each vertical arrangement of bit lines 608 may have opposing sidewalls 607 along the length of the vertical arrangement of bit lines 608. Each vertical arrangement of bit lines 608 may be formed by removing sections of the initial stack that are outside of the identified bit line locations 608. A perspective view of an example embodiment of vertical arrangements of bit lines 608 is illustrated in FIG. 6C.

(5) Forming a Plurality of Word Lines (e.g., Action 510)

In example embodiments, the formation of a word line 610 may be achievable by forming a thin conductive layer 614 over selected sections of the opposing sidewalls 607 of the vertical arrangement of bit lines 608 and depositing a conductive material 614' adjacent to each thin conductive layer 614. The selected sections of the opposing sidewalls 607 of the vertical arrangement of bit lines 608 where the thin conductive layers 614 are formed may include only those sections that are within identified word line locations 610 in example embodiments. The aforementioned forming of the thin conductive layers 614 and the depositing of conductive material 614' adjacent to each thin conductive layer 614 may be performed in one or more of a plurality of ways, as explained below.

(5A) First Example Embodiment

FIGS. 6D-J provide example illustrations of an example embodiment of fabricating a semiconductor device 600.

Figure 6D:
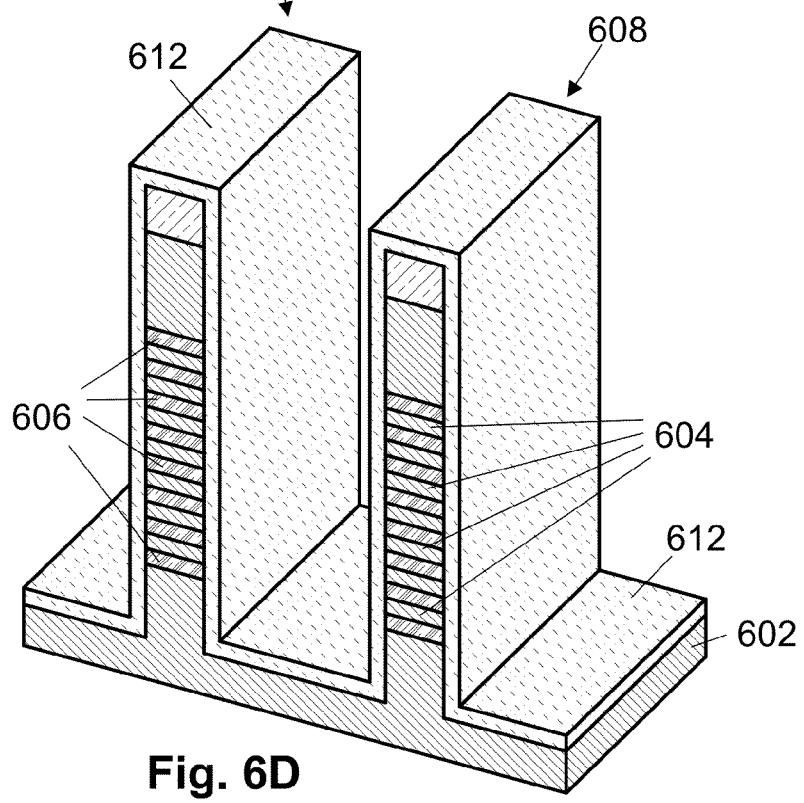
FIG. 6D is a perspective view of a charge trapping layer formed over the plurality of vertical arrangement of bit lines.

As illustrated in the perspective view illustration of FIG. 6D, after the vertical arrangements of bit lines 608 are formed (e.g., action 508), a charge trapping layer 612 may be formed over at least a section of the vertical arrangements of bit lines 608. In example embodiments, the charge trapping layer 612 may be formed over a top surface and the opposing sidewalls 607 of the vertical arrangements of bit lines 608. The charge trapping layer 612 may also be formed on the exposed portions of the substrate 602 between vertical arrangements of bit lines 608 in example embodiments. The charge trapping layer 612 may be an oxide-nitride-oxide (or ONO), high-K dielectric inter-gate-dielectric (or high-K IGD) layer, or any other suitable configuration. The thickness of the charge trapping layer 612 may be about 210 Angstroms. It is recognized in the present disclosure that the thickness of charge trapping layer 612 may be about 180 to about 250 Angstroms in example embodiments.

Figure 6E:
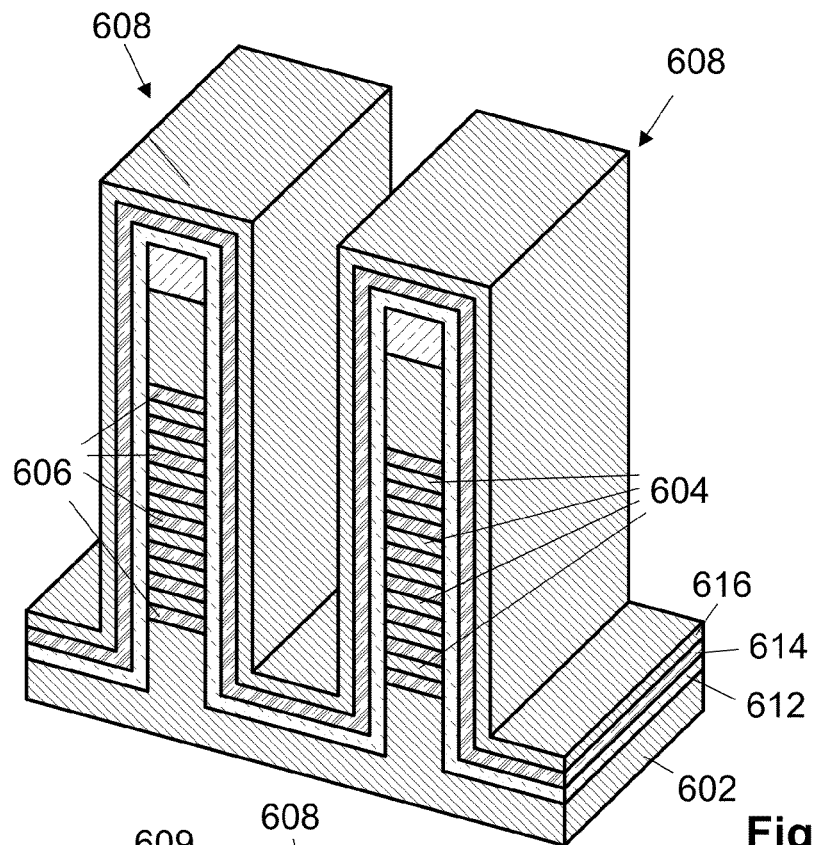
FIG. 6E is a perspective view of an insulative layer, a conductive layer, and a charge trapping layer formed over the plurality of vertical arrangement of bit lines.

A thin layer of conductive material 614 may be formed over the charge trapping layer 616. A thin layer of insulative material 616 may also be formed over the conductive layer 614 in example embodiments. The thickness of the conductive layer 614 may be about 200 Angstroms. It is recognized in the present disclosure that the thickness of the conductive layer 614 may be about 100 to about 300 Angstroms in example embodiments. The thickness of the insulative layer 616 may be about 150 Angstroms. It is recognized in the present disclosure that the thickness of the insulative layer 616 may be about 100 to about 200 Angstroms in example embodiments. FIG. 6E illustrates an example perspective view of vertical arrangements of bit lines 608 having a thin charge trapping layer 612, thin conductive layer 614, and thin insulative layer 616 formed thereon.

Figure 6F:
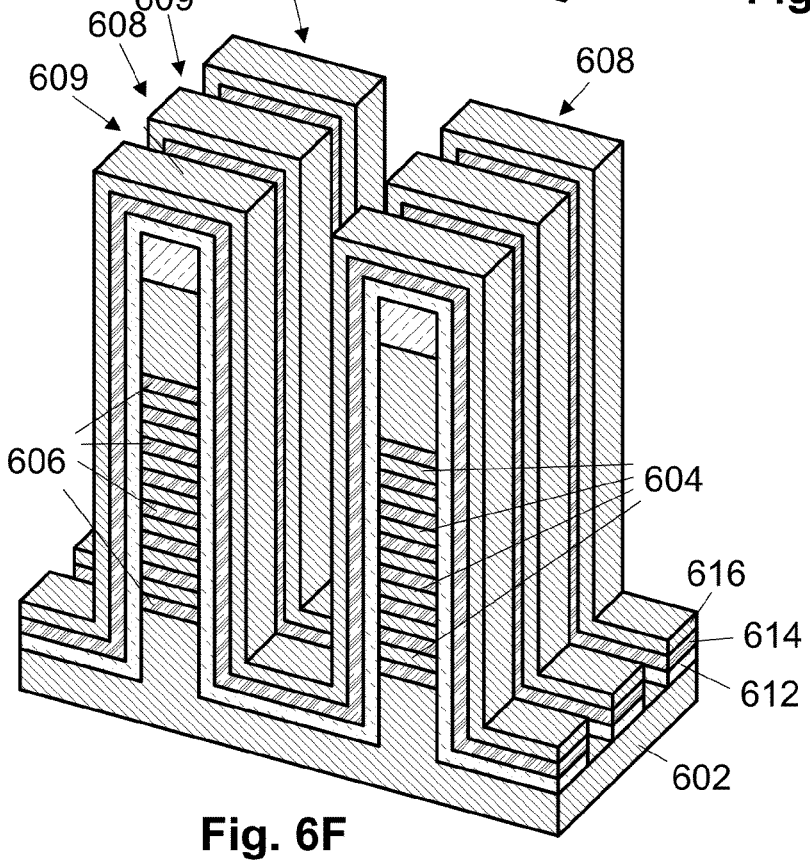
FIG. 6F is a perspective view of removing selected sections of the insulative layer, conductive layer, and charge trapping layer.

Selected sections 609 of the thin charge trapping layer 612, the thin conductive layer 614, and the thin insulative layer 616 may then be removed. The removed selected sections 609 may include those sections that are outside of the identified word line locations 610, as illustrated in FIG. 6F. In removing the selected sections 609, only certain remaining sections of the thin conductive layer 614 (and charge trapping layer 612 and thin insulative layer 16) remain and these remaining sections are within the word line locations 610. It is to be understood in the present disclosure that other actions may be used to form the thin conductive layer 614 on selected sections of the sidewalls 607 (i.e., within word line locations) in addition to or in replacement of the aforementioned actions without departing from the teachings of the present disclosure.

Figure 6G:
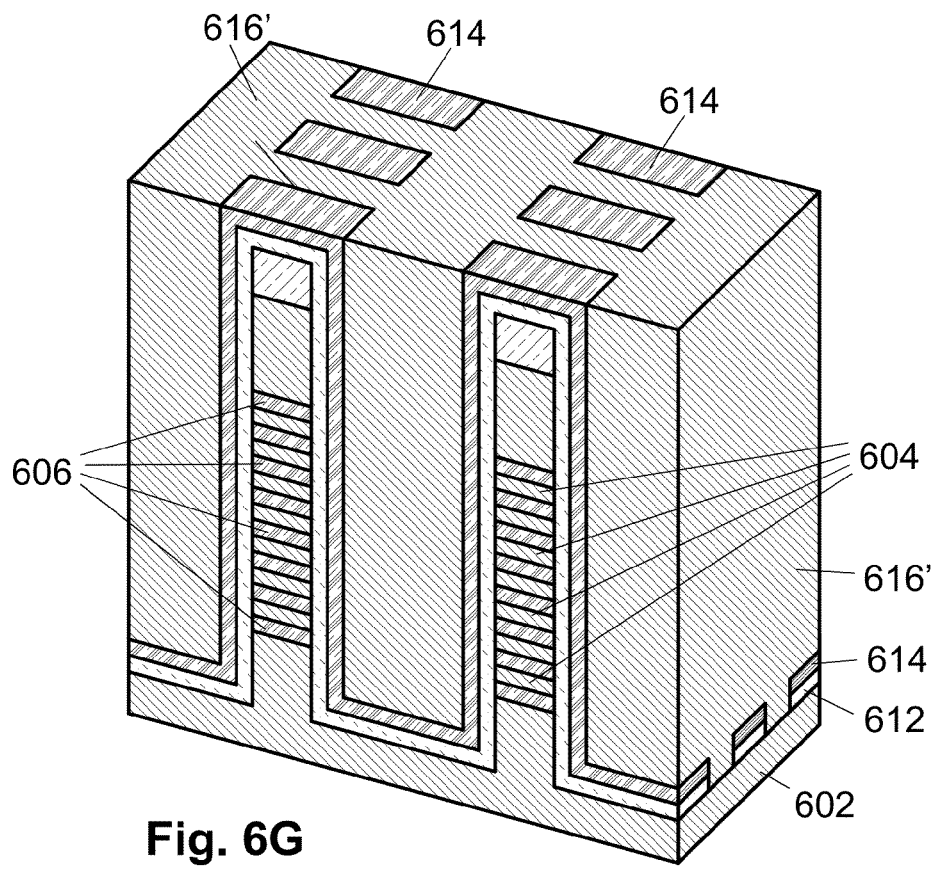
FIG. 6G is a perspective view of depositing insulative material.

As illustrated in FIG. 6G, insulative material 616' may be deposited in areas outside of the identified bit line locations 608. In example embodiments, insulative material 616' may also be deposited in the removed sections 609.

Figure 6H:
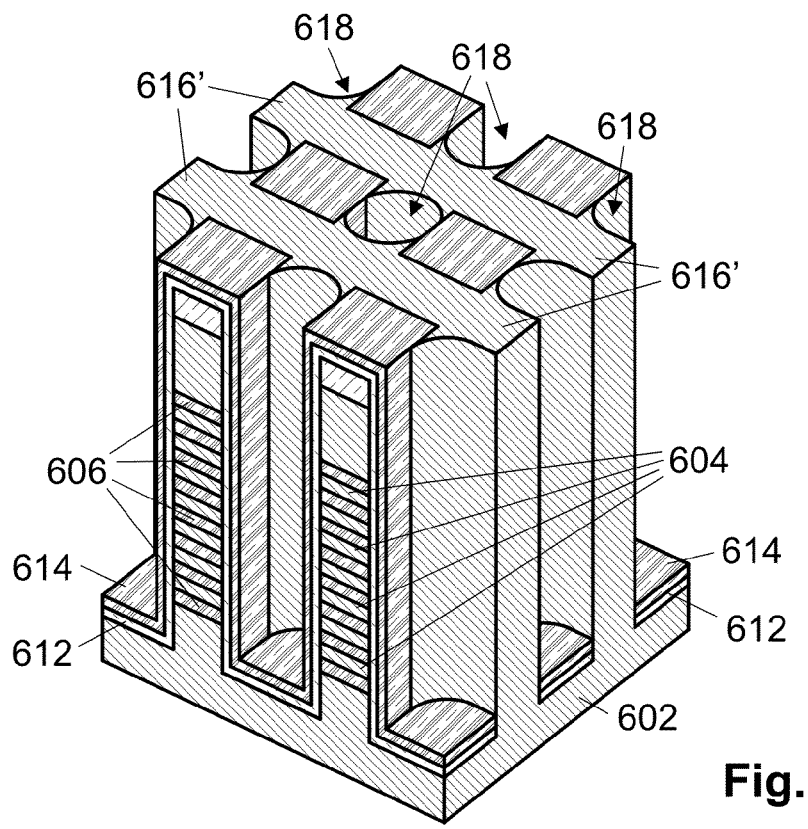
FIG. 6H is a perspective view of removing selected sections of the deposited insulative material so as to form holes.

As illustrated in FIG. 6H, selected sections 618 of the deposited insulative material 616' may be removed so as to form holes 618 that expose at least a portion of the conductive layer 614. Each selected section (hole) 618 removed may include those sections along an identified word line location 610. In example embodiments, the holes 618 may have a dimension of less than or equal to about the width of the word line 610. The selected sections (holes) 618 of the deposited insulative material 616' removed may correspond to one or more sections of the deposited insulative material 616' that are in direct contact with the thin conductive layers 614 formed on the sidewalls 607 (i.e., the removal process exposes at least a section of the thin conductive layer 614). It is to be understood in the present disclosure that the removing of the selected sections 618 of the deposited insulative material 616' so as to form holes 618, as described above and herein, allows for the formation of an insulative separation (via the remaining insulative material 616') to be formed between adjacent word lines 610. Furthermore, the removing of the selected sections 618 of the deposited insulative material 616' allows for the next step of forming a connection or bridge between corresponding (or facing) thin conductive layers 614a and 614b formed on adjacent bit lines (see FIG. 6J).

Although the removed sections (holes) 618 of the deposited insulative material 616' are depicted in FIG. 6H as having circular cross-sections, it is to be understood in the present disclosure that the removed sections (holes) 618 of the deposited insulative material 616' may have one or more other cross-sectional shapes, including square, rectangular, oval, and other shapes.

Figure 6I:
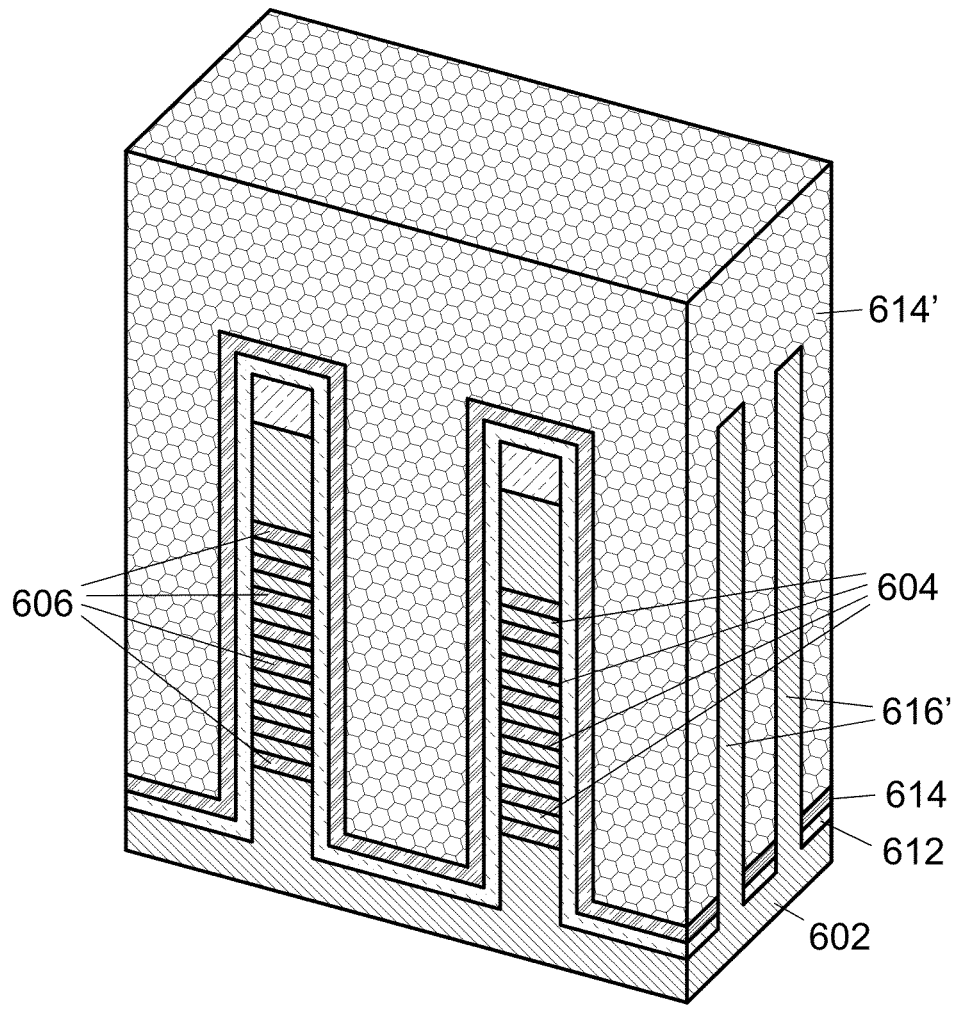
FIG. 6I is a perspective view of depositing conductive material in the formed holes.
Figure 6J:
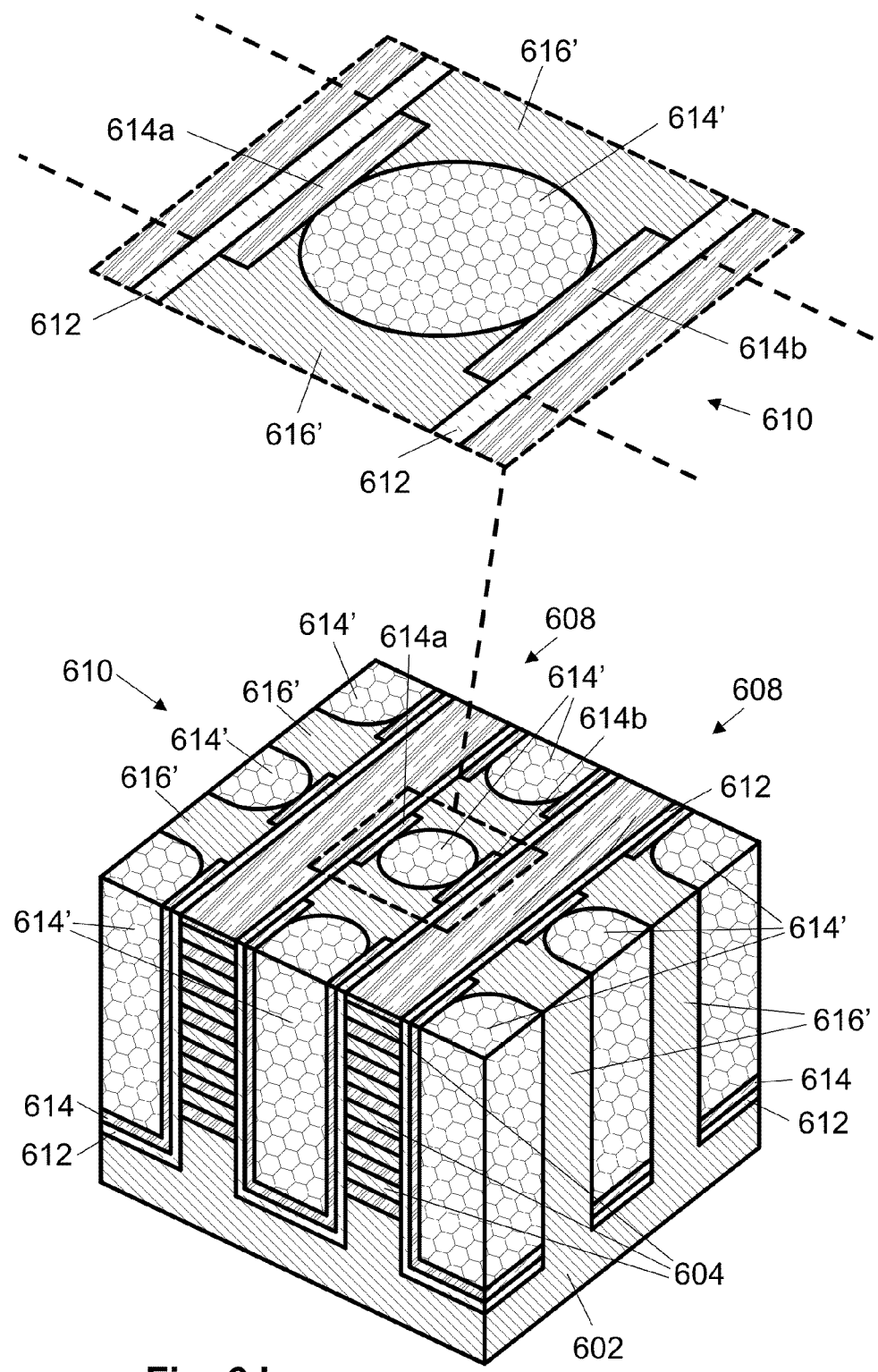
FIG. 6J is a cross-sectional perspective view of the formed word lines and bit lines of the semiconductor device.

As illustrated in FIG. 6I and FIG. 6J, a deposition process may be performed so as to deposit conductive material 614' into at least the removed sections (holes) 618 of the deposited insulative material 616'. As illustrated in the cross-sectional perspective view of FIG. 6J, each portion (between consecutive bit lines 608) of a word line 610 may comprise thin layers of conductive material 614a and 614b and conductive structure 614' connected to each of the thin layers of conductive material 614a and 614b.

Although the conductive structures 614' are depicted in FIGS. 6I-J as having circular cross-sections, it is to be understood in the present disclosure that the conductive structures 614' may have one or more other cross-sectional shapes, including square, rectangular, oval, and other shapes.

(5B) Second Example Embodiment

FIGS. 7A-F provide example illustrations of another example embodiment of fabricating a semiconductor device 600.

Figure 7A:
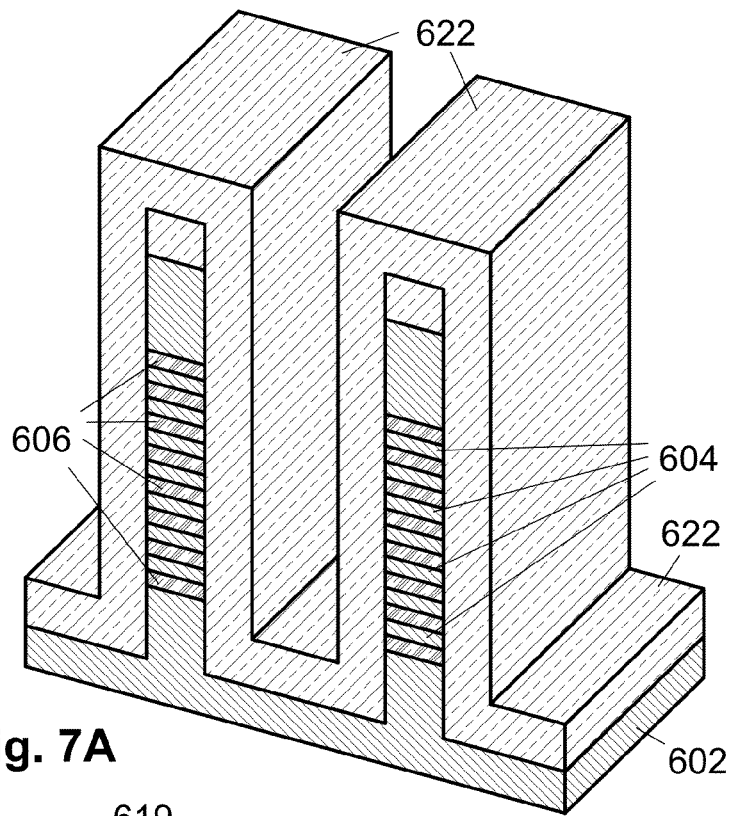
FIG. 7A is a perspective view of a first dielectric layer formed over a plurality of vertical arrangement of bit lines.

As illustrated in the perspective view illustration of FIG. 7A, after the vertical arrangements of bit lines 608 are formed (e.g., action 508), a first dielectric layer 622 may be formed over the vertical arrangements of bit lines 608. In example embodiments, the first dielectric layer 622 may be formed on a top surface and the opposing sidewalls 607 of the vertical arrangements of bit lines 608. The first dielectric layer 622 may also be formed on the exposed portions of the substrate 602 between vertical arrangements of bit lines 608 in example embodiments. The first dielectric layer 622 may comprise nitrogen, such as SiN, in example embodiments. The thickness of the first dielectric layer 622 may be about 250 Angstroms. It is recognized in the present disclosure that the thickness of first dielectric layer 622 may be about 200 to about 300 Angstroms in example embodiments.

Figure 7B:
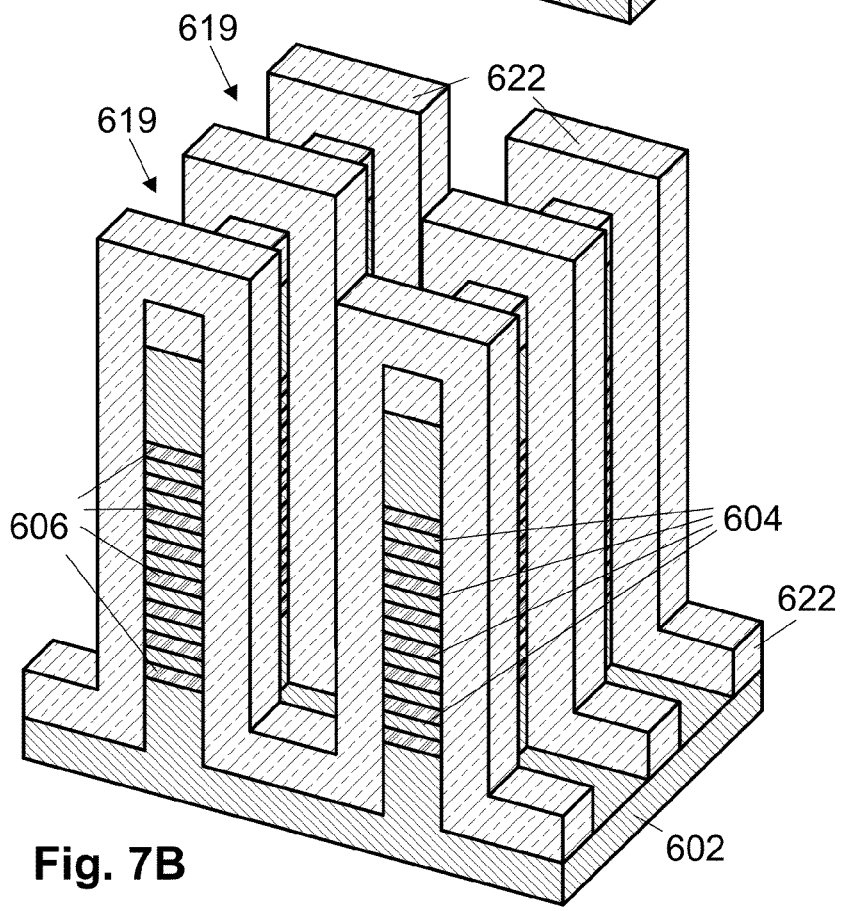
FIG. 7B is a perspective view of removing selected sections of the first dielectric layer.

Selected sections 619 of the first dielectric layer 622 may be removed. The removed selected sections 619 may include those sections that are outside of the identified word line locations 610, as illustrated in FIG. 7B. In removing the selected sections 619, only certain remaining sections of the first dielectric layer 622 remain and these remaining sections are within the word line locations 610. It is to be understood in the present disclosure that other actions may be used to form the first dielectric layer 622 on selected sections of the sidewalls 607 (i.e., within word line locations) in addition to or in replacement of the aforementioned actions without departing from the teachings of the present disclosure.

Figure 7C:
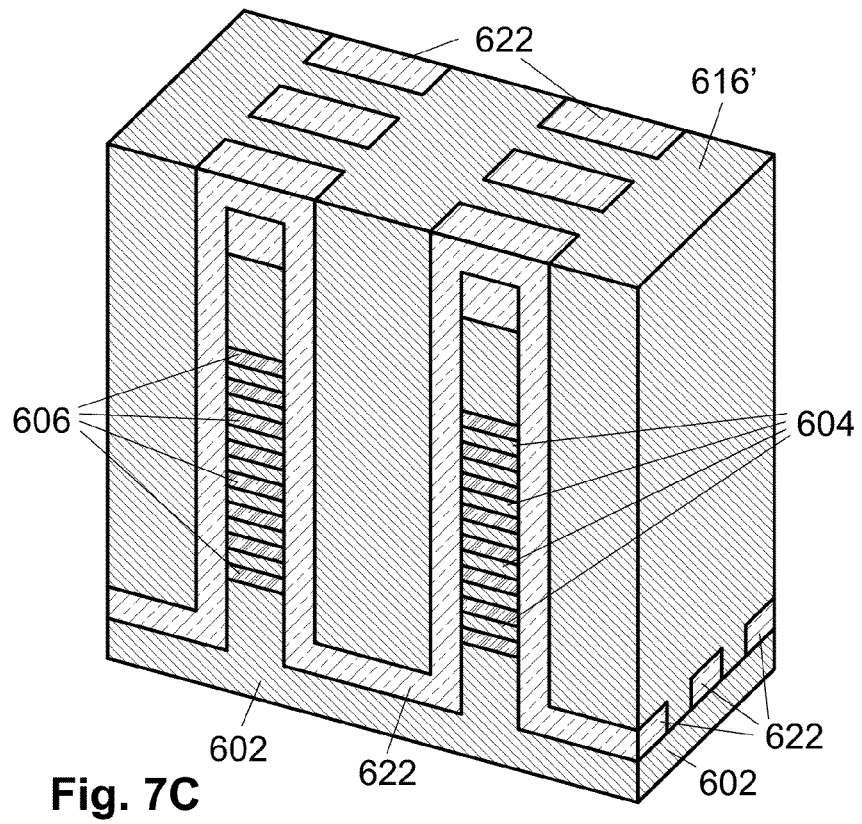
FIG. 7C is a perspective view of depositing a second dielectric material.

As illustrated in FIG. 7C, a second dielectric material 616' may be deposited in areas outside of the identified bit line locations 608. In example embodiments, the second dielectric material may also deposited in the removed sections 619.

Figure 7D:
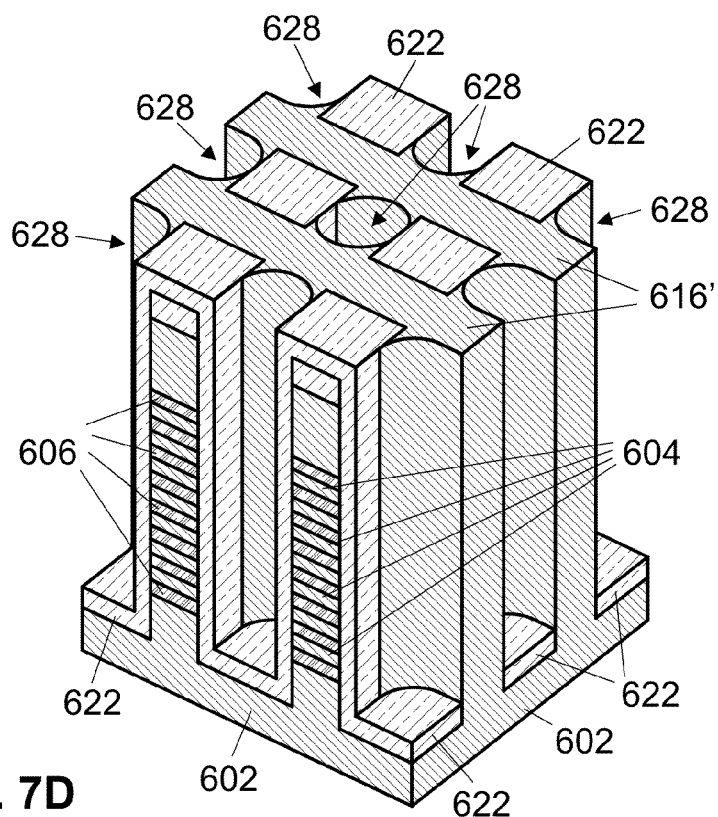
FIG. 7D is a perspective view of removing selected sections of the deposited second dielectric material so as to form holes.

As illustrated in FIG. 7D, selected section 628 of the deposited second dielectric material 616' may be removed so as to form holes 628 that expose at least a portion of the first dielectric layer 622. Each selected section (hole) 628 removed may include sections along an identified word line location 610. In example embodiments, the holes 628 may have a dimension of less than or equal to about the width of the word line 610. The selected section (hole) 628 of the deposited second dielectric material 616' removed may correspond to one or more sections of the deposited second dielectric material 616' that are in direct contact with the first dielectric layer 622 formed on the sidewalls 607 (i.e., removal exposes at least a section of the first dielectric layer 622). It is to be understood in the present disclosure that the removing of the selected sections 628 of the deposited second dielectric material 616' so as to form holes 628, as described above and herein, allows for the formation of an insulative separation region 630 to be formed between adjacent word lines 610.

Although the removed sections (holes) 628 of the deposited second dielectric material 616' is depicted in FIG. 7D as having circular cross-sections, it is to be understood in the present disclosure that the removed sections (holes) 628 of the deposited second dielectric material 616' may have one or more other cross-sectional shapes, including square, rectangular, oval, and other shapes.

Figure 7E:
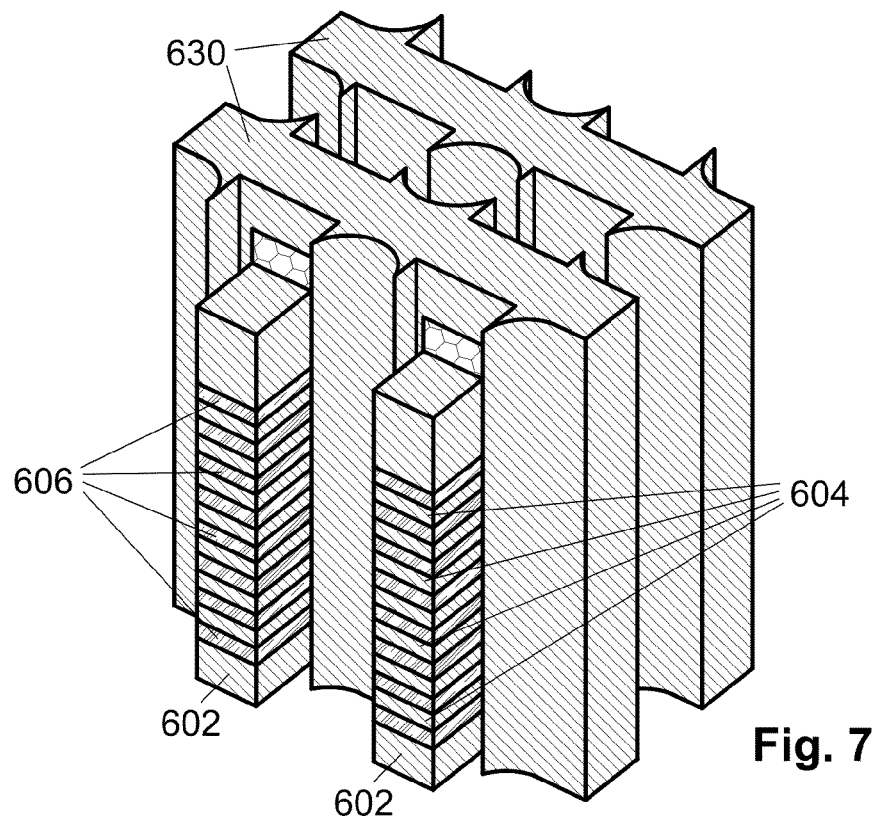
FIG. 7E is a perspective view of removing selected sections of the first dielectric material.
Figure 7F:
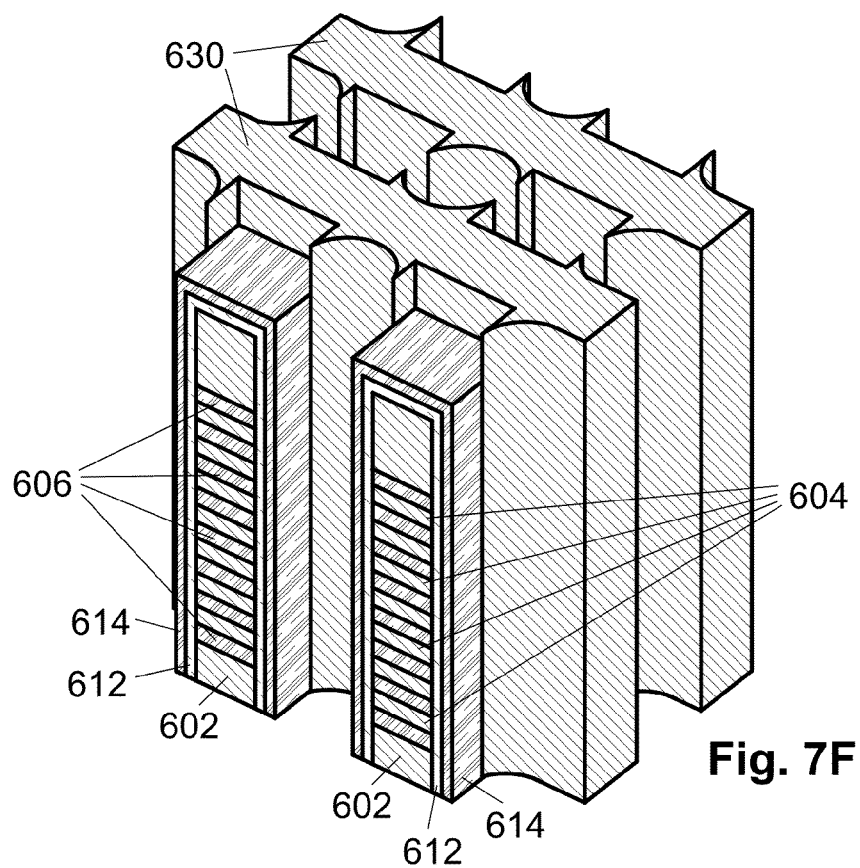
FIG. 7F is a perspective view of forming a charge trapping layer and conductive layer over selected sections of the vertical arrangement of bit lines.

Thereafter, the first dielectric material 622 within the identified word line locations 610 may be removed so as to expose a selected section of the sidewalls 607 of the vertical arrangement of bit lines 608, the selected sections being those sections within identified word line locations 610. This is illustrated in FIG. 7E. As illustrated in FIG. 7E, the remaining second dielectric material 616' forms an insulative separation region 630. This insulative separation region 630 enables a subsequent action of forming, within the identified word line locations 610, of a charge-trapping layer 612 over the top surface and sidewalls 607 of the vertical arrangement of bit lines 608, as well as the surface of the substrate 602. Furthermore, one or more other steps may be performed in a similar matter as described above and herein for FIG. 6 so as to form or arrive at a thin layer of conductive material 614 (including 614a and 614b) over a selected section of the charge-trapping layer 612 and conductive structures 618a. In this regard, the selected sections are those sections within identified word line locations 610. Furthermore, conductive structures 614' may also be formed between corresponding thin layers of conductive material 614a and 614b so as to connect the corresponding thin layers of conductive material 614a and 614b, as illustrated in the cross-sectional perspective view of FIG. 7G.

Figure 7G:
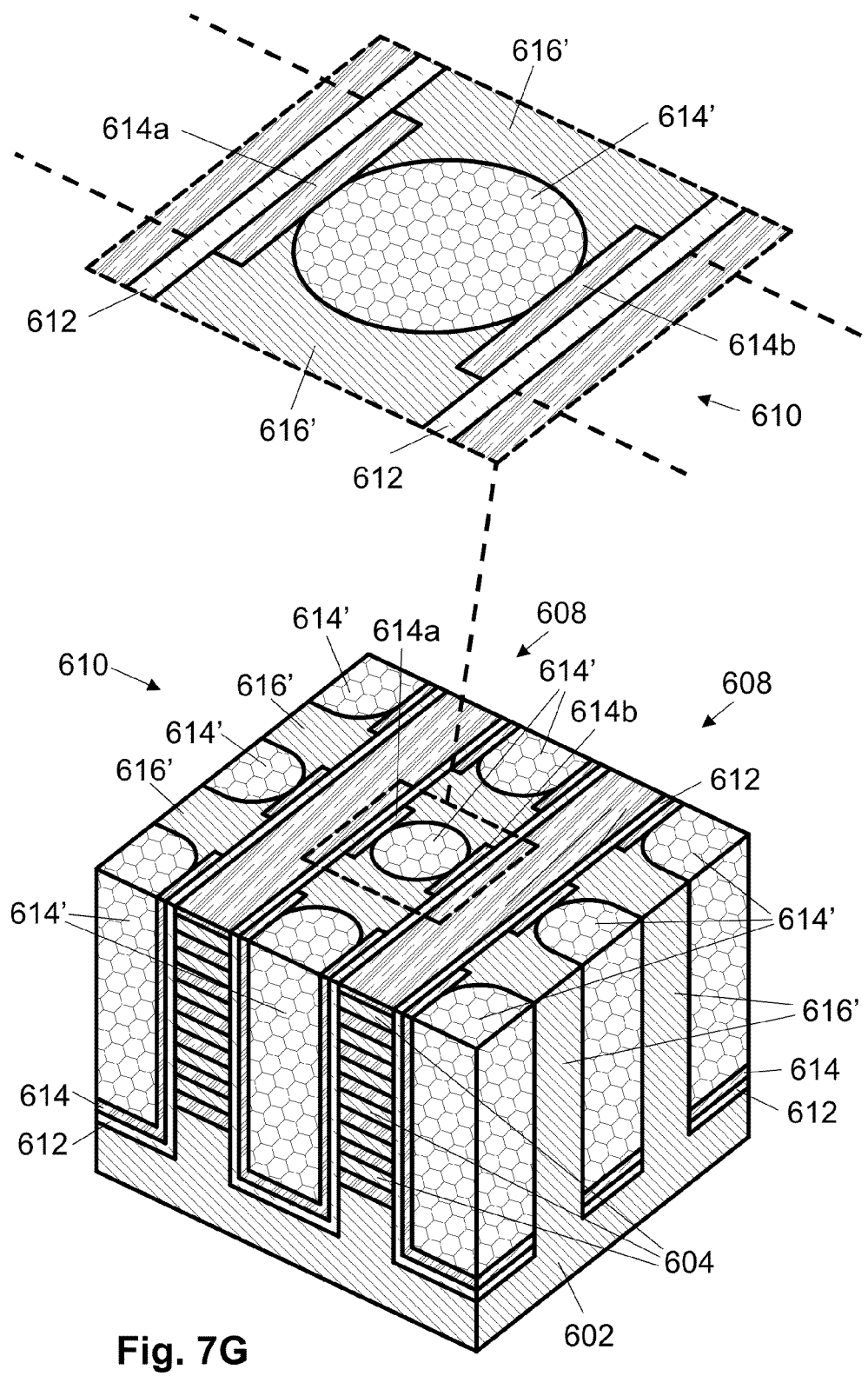
FIG. 7G is a cross-sectional perspective view of the formed word lines and bit lines of the semiconductor device.

Although the conductive structures 614' are depicted in FIG. 7G as having circular cross-sections, it is to be understood in the present disclosure that the conductive structures 614' may have one or more other cross-sectional shapes, including square, rectangular, oval, and other shapes.

It is to be understood in the present disclosure that the charge storage structure may include oxide-nitride-oxide, silicon-oxide-nitride-oxide-silicon (SONOS), or BE-SONOS structures, including those comprising a tunneling dielectric layer, a trapping layer, and a blocking oxide layer. The tunneling dielectric layer may comprise oxide, nitride, and oxide sub-layers and/or a composite of materials forming an inverted "U" shaped valence band under zero bias voltage; the trapping layer may comprise nitride; and the blocking oxide or gate layer may comprise oxide. The tunneling dielectric layer may further include a hole tunneling layer, a band offset layer, and an isolation layer. Other internal structures are also contemplated in this disclosure, including those for floating gate memory, charge trapping memory, NAND-type devices, semiconductor devices other than NAND-type devices, non-volatile memory devices, and/or embedded memory devices.

While various embodiments in accordance with the disclosed principles have been described above, it should be understood that they have been presented by way of example only, and are not limiting. Thus, the breadth and scope of the example embodiments described in the present disclosure should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

For example, as referred to in the present disclosure, "forming" or "fabricating" a layer, plurality of layers, plurality of alternating layers, multilayer, stack, structure and/or device may include any method of creating the layer, multilayer, structure, and/or device, including depositing, patterning, etching, and/or the like. A "multilayer" may be one layer, structure, and/or stack comprising a plurality of internal layers and/or a plurality of layers, multilayers, structures, and/or stacks stacked or formed on or over one another. Internal structures may include any internal structure of a semiconductor device, including charge storage structures such as silicon-oxide-nitride-oxide-silicon (SONOS) or bandgap engineered silicon-oxide-nitride-oxide-silicon (BE-SONOS) structures comprising a tunneling dielectric layer, a trapping layer, and a blocking oxide layer.

Although one or more layers, multilayers, and/or structures may be described in the present disclosure as being "silicon," "polysilicon," "conductive," "oxide," and/or "insulative" layers, multilayers, and/or structures, it is to be understood that example embodiments may be applied for other materials and/or compositions of the layers, multilayers, and/or structures. Furthermore, such structures may be in the form of a crystalline structure and/or amorphous structure in example embodiments.

Furthermore, "patterning" or "etching" of one or more layers, multilayers, and/or structures may include any method of creating a desired pattern on the one or more layers, multilayers, and/or structures, including performing a photolithography process by applying a photoresist mask (not shown) having pre-formed patterns and etching the layers, multilayers, and/or structures according to the pre-formed patterns on the photoresist mask.

"Stringers" formed, deposited, and/or remaining in and/or on material(s), layer(s), structure(s), and/or between materials, layers, and/or structures may include conductive material, insulative material, and materials having openings, bores, gaps, voids, cracks, holes, bubbles, and the like, and/or a mixture thereof. Furthermore, although the present disclosure describes example embodiments for addressing "stringers," the claimed approaches described in the present disclosure may also be beneficially applicable to address and/or improve other performance-related problems and/or issues, including formation, shifting, changing in size, changing in shape, changing in composition, combining, dividing, and/or migrating of other types of imperfections in the semiconductor fabrication process.

It is to be understood in the present disclosure that the principles described can be applied outside the context of NAND-type devices described in exemplary embodiments, including NOR-type devices, other memory storage devices, floating gate memory devices, charge trapping memory devices, non-volatile memory devices, and/or embedded memory devices.

Various terms used herein have special meanings within the present technical field. Whether a particular term should be construed as such a "term of art" depends on the context in which that term is used. "Connected to," "forming on,"

"forming over," or other similar terms should generally be construed broadly to include situations where formations, depositions, and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method of fabricating a semiconductor device, the method comprising:
    forming an initial stack of alternating insulative and conductive layers over a substrate;
    identifying a plurality of bit line locations and word line locations for the initial stack, including a first bit line location and a first word line location;
    forming, from the initial stack, a vertical arrangement of bit lines in the first bit line location, the vertical arrangement of bit lines having opposing sidewalls; and
    forming a word line in the first word line location by:
        forming a thin conductive layer over selected sections of the opposing sidewalls, the selected sections of the opposing sidewalls being sections within the first word line location; and
        depositing conductive material adjacent to each thin conductive layer, the deposited conductive material in direct contact with the thin conductive layer.

2. The method of claim 1, wherein the vertical arrangement of bit lines is formed by removing sections of the initial stack outside of the first bit line location.

3. The method of claim 2, wherein after removing the sections of the initial stack, forming a charge trapping layer over at least the opposing sidewalls before forming the thin conductive layers.

4. The method of claim 3, wherein the charge trapping layer is also formed over a top surface of the vertical arrangement of bit lines and over selected areas of the substrate, the selected areas of the substrate being areas within the first word line location.

5. The method of claim 4, wherein the thin conductive layers are also formed over selected areas of the top surface of the vertical arrangement of bit lines, the selected areas of the top surface being areas within the first word line location.

6. The method of claim 1, wherein after forming the thin conductive layers over the selected sections of the opposing sidewalls:
    depositing insulative material in areas outside of the identified bit line locations; and
    removing selected sections of the deposited insulative material, each selected section of the deposited insulative material being a section in direct contact with each thin conductive layer.

7. The method of claim 6, wherein the depositing the conductive material adjacent to each of the thin conductive layers is performed in the removed selected sections of the deposited insulative material.

8. The method of claim 2, wherein prior to forming the thin conductive layers over the selected sections of the opposing sidewalls:
    forming a thin layer of a first dielectric material over the selected sections of the opposing sidewalls; and
    depositing a second dielectric material in the removed sections of the initial stack outside of the first bit line location.

9. The method of claim 8, wherein the forming the thin conductive layers and the depositing the conductive material comprises:
    replacing only selected sections of the deposited second dielectric material with conductive material, each selected section of the deposited second dielectric material being a section in direct contact with each thin layer of first dielectric material; and
    replacing the thin layers of first dielectric material with conductive material.

10. The method of claim 8, wherein prior to forming the thin conductive layers:
    removing selected sections of the deposited second dielectric material, each selected section of the deposited second dielectric material being a section in direct contact with each thin layer of first dielectric material; and
    removing the thin layer of first dielectric material.

11. A method of fabricating a semiconductor device, the method comprising:
    forming an initial stack of alternating insulative and conductive layers over a substrate;
    identifying bit line and word line locations for the initial stack;
    forming, from the initial stack, a plurality of vertical arrangements of bit lines, including a first vertical arrangement of bit lines and a second vertical arrangement of bit lines, each vertical arrangement of bit lines having opposing sidewalls;
    forming a thin conductive layer over selected sections of the opposing sidewalls of the first vertical arrangement of bit lines and second vertical arrangement of bit lines, the selected sections of the opposing sidewalls being sections within the identified word line locations; and
    connecting, via conductive material, each thin conductive layer formed on the first vertical arrangement of bit lines with a corresponding thin conductive layer formed on the second vertical arrangement of bit lines, each corresponding thin conductive layer formed on the second vertical arrangement of bit lines facing the thin conductive layer formed on the first vertical arrangement of bit lines.

12. The method of claim 11, wherein the first vertical arrangement of bit lines and the second vertical arrangement of bit lines are formed by removing sections of the initial stack outside of the identified bit line locations, including the sections of the initial stack between the first vertical arrangement of bit lines and the second vertical arrangement of bit lines.

13. The method of claim 12, wherein after removing the sections of the initial stack outside of the identified bit line locations, forming a charge trapping layer over at least the opposing sidewalls before forming the thin conductive layers.

14. The method of claim 13, wherein the charge trapping layer is also formed over a top surface of the first vertical arrangement of bit lines, a top surface of the second vertical arrangement of bit lines, and over selected areas of the substrate, the selected areas of the substrate being areas within the identified word line locations.

15. The method of claim 14, wherein the thin conductive layers are also formed over selected areas of the top surfaces of the first vertical arrangement of bit lines and second vertical arrangement of bit lines, the selected areas of the top surfaces being areas within the identified word line locations.

16. The method of claim 11, wherein after forming the thin conductive layers over the select sections of the opposing sidewalls:
   depositing insulative material in areas outside of the identified bit line locations; and
   removing selected sections of the deposited insulative material, each selected section of the deposited insulative material being a section in direct contact with each thin conductive layer.

17. The method of claim 16, wherein the connecting the thin conductive layers is performed by depositing conductive material in the removed selected sections of the deposited insulative material.

18. The method of claim 12, wherein prior to forming the thin conductive layers over the selected sections of the opposing sidewalls:
   forming a thin layer of a first dielectric material over the selected sections of the opposing sidewalls; and
   depositing a second dielectric material in the removed sections of the initial stack outside of the identified bit line locations.

19. The method of claim 18, wherein the forming the thin conductive layers and the connecting the thin conductive layers comprises:
   replacing only selected sections of the deposited second dielectric material with conductive material, the selected sections of the deposited second dielectric material being sections between each thin layer of first dielectric material formed on the first vertical arrangement of bit lines and a corresponding thin layer of first dielectric material formed on the second vertical arrangement of bit lines; and
   replacing the thin layers of first dielectric material with conductive material;
   wherein each corresponding thin layer of first dielectric material formed on the second vertical arrangement of bit lines faces each thin layer of first dielectric material formed on the first vertical arrangement of bit lines.

20. The method of claim 18, wherein prior to forming the thin conductive layers:
   removing selected sections of the deposited second dielectric material, the selected sections of the deposited second dielectric material being sections between each thin layer of first dielectric material formed on the first vertical arrangement of bit lines and a corresponding thin layer of first dielectric material formed on the second vertical arrangement of bit lines; and
   removing the thin layer of first dielectric material;
   wherein each corresponding thin layer of first dielectric material formed on the second vertical arrangement of bit lines faces each thin layer of first dielectric material formed on the first vertical arrangement of bit lines.

21. A semiconductor device comprising:
   a substrate;
   a first vertical arrangement of bit lines and a second vertical arrangement of bit lines formed over the substrate, each vertical arrangement of bit lines having opposing sidewalls and comprising alternating insulative and conductive layers; and
   a plurality of word lines, each word line having:
      a thin conductive layer formed over selected sections of the opposing sidewalls of the first vertical arrangement of bit lines and the second vertical arrangement of bit lines, the selected sections of the opposing sidewalls being sections within the word lines; and
      a conductive structure connecting each thin conductive layer formed on the first vertical arrangement of bit lines with a corresponding thin conductive layer formed on the second vertical arrangement of bit lines, each corresponding thin conductive layer formed on the second vertical arrangement of bit lines facing the thin conductive layer formed on the first vertical arrangement of bit lines.

22. The semiconductor device of claim 21, further comprising a charge storage layer formed over the first vertical arrangement of bit lines and the second vertical arrangement of bit lines.

23. The semiconductor device of claim 22, wherein the charge storage layer is formed between the sidewalls and each thin conductive layer.

24. The semiconductor device of claim 22, wherein the charge storage layer comprises an oxygen-nitrogen-oxygen (ONO) layer.

25. The semiconductor device of claim 21, further comprising insulative material formed between consecutive conductive structures.

26. The semiconductor device of claim 21, wherein the thin conductive layers and the conductive structures comprise the same conductive material.

* * * * *